United States Patent
Lambert et al.

(10) Patent No.: US 10,496,580 B1
(45) Date of Patent: Dec. 3, 2019

(54) SYSTEM AND METHOD OF CONFIGURING INFORMATION HANDLING SYSTEMS

(71) Applicant: Dell Products L.P., Round Rock, TX (US)

(72) Inventors: Timothy M. Lambert, Austin, TX (US); Jordan H. Chin, Austin, TX (US); Jeffrey Leighton Kennedy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/053,156

(22) Filed: Aug. 2, 2018

(51) Int. Cl.
  *G06F 13/40* (2006.01)
  *H03M 9/00* (2006.01)

(52) U.S. Cl.
  CPC ...... *G06F 13/4018* (2013.01); *G06F 13/4054* (2013.01); *H03M 9/00* (2013.01); *G06F 2213/0026* (2013.01)

(58) Field of Classification Search
  CPC combination set(s) only.
  See application file for complete search history.

(56) References Cited

U.S. PATENT DOCUMENTS

| | | | |
|---|---|---|---|
| 7,327,160 B1 * | 2/2008 | Agrawal | H03K 19/17736 326/38 |
| 7,363,402 B2 * | 4/2008 | Lesartre | G06F 13/4282 710/36 |
| 7,831,754 B1 * | 11/2010 | Chen | G06F 13/12 326/38 |
| 8,466,365 B2 | 6/2013 | Gundel | |
| 8,933,333 B2 | 1/2015 | Gundel | |
| 9,208,927 B2 | 12/2015 | Gundel | |
| 9,601,236 B2 | 3/2017 | Gundel | |
| 2003/0236919 A1 * | 12/2003 | Johnson | G06Q 10/10 709/251 |
| 2012/0287926 A1 * | 11/2012 | Anantharam | H04L 49/356 370/355 |
| 2015/0012677 A1 * | 1/2015 | Nagarajan | G06F 13/4022 710/106 |
| 2015/0180803 A1 * | 6/2015 | Li | H04L 49/15 370/458 |

OTHER PUBLICATIONS

3M High-Speed Cable Assembly Solutions, 3M Science Applied to Life, 2017; 2 pages.

(Continued)

*Primary Examiner* — Raymond N Phan
(74) *Attorney, Agent, or Firm* — Baker Botts L.L.P.

(57) ABSTRACT

In one or more embodiments, one or more systems, methods, and/or systems may provide an output signal via a first port of multiple ports; may determine that the output signal is detected via a second port of the multiple ports; if the first port and the second port are not capable of being coupled, may provide a notification that indicates that the first port and the second port are not capable of being coupled; and if the first port and the second port are capable of being coupled: may configure a Serializer/Deserializer (SerDes) associated with the first port to communicate with a SerDes associated with the second port; and may configure a first processor of multiple processors to communicate with a second processor of the multiple processors via the SerDes associated with the first port.

17 Claims, 13 Drawing Sheets

(56) References Cited

OTHER PUBLICATIONS

Go the distance. 3M SlimLine Twin Axial Cable Assembly (SFF-8654) for SAS and PCIe Applications, 3M Science Applied to Life, 2018; 4 pages.
Cables and Accessories Selection Guide, 3M Science Applied to Life, 2015; 24 pages.
3M SlimLine Twin Axial Cable Assembly (SFF-8654) for SAS and PCIe Applications, Jan. 10, 2017; 2 pages.
3M SlimLine Twin Axial Cable Assembly (SFF-8654) for SAS and PCIe Applications, Mar. 27, 2017; 2 pages.

\* cited by examiner

SYSTEM AND METHOD OF CONFIGURING INFORMATION HANDLING SYSTEMS

BACKGROUND

Field of the Disclosure

This disclosure relates generally to information handling systems and more particularly to configuring information handling systems to utilize communications with other devices and/or with processors.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, methods, and/or processes may provide an output signal via a first port of multiple ports; may determine that the output signal is detected via a second port of the multiple ports; and may determine if the first port and the second port are capable of being coupled. If the first port and the second port are not capable of being coupled, the one or more systems, methods, and/or processes, according to one or more embodiments, may further disengage at least one of a Serializer/Deserializer (SerDes) associated with the first port and a SerDes associated with the second port and may further provide a notification that indicates that the first port and the second port are not capable of being coupled. If the first port and the second port are capable of being coupled, the one or more systems, methods, and/or processes may further determine if a type of a coupling coupled to the first port and the second port is applicable, according to one or more embodiments. If the type of the coupling coupled to the first port and the second port is applicable, the one or more systems, methods, and/or processes, according to one or more embodiments, may further configure the SerDes associated with the first port to communicate with the SerDes associated with the second port and may further configure a first processor of multiple processors to communicate with a second processor of the multiple processors via the SerDes associated with the first port. If the type of the coupling coupled to the first port and the second port is not applicable, the one or more systems, methods, and/or processes may further provide a notification that indicates that the type of the coupling coupled to the first port and the second port is not applicable, according to one or more embodiments.

In one or more embodiments, the one or more systems, methods, and/or processes may further determine that the output signal is not detected via the second port of the multiple ports. In one or more embodiments, the one or more systems, methods, and/or processes may further determine if the second port is coupled to a backplane. If the second port is coupled to the backplane, the one or more systems, methods, and/or processes, according to one or more embodiments, may further determine a type of a coupling to the backplane and may further configure the SerDes associated with the second port based at least on the type of the coupling to the backplane. If the second port is not coupled to the backplane, the one or more systems, methods, and/or processes may further disengage the SerDes associated with the second port, according to one or more embodiments.

In one or more embodiments, the one or more systems, methods, and/or processes may further determine, based at least on the type of the coupling to the backplane, at least one of a reactive load and a resistive load to be introduced to a signal path coupled to the second port and may further introduce the at least one of the reactive load and the resistive load to the signal path. For example, determining, based at least on the type of the coupling to the backplane, the at least one of the reactive load and the resistive load to be introduced to the signal path coupled to the second port may be performed after determining the type of the coupling to the backplane.

In one or more embodiments, the one or more systems, methods, and/or processes may further determine that the output signal is detected via a third port of the multiple ports, may further determine that a type of a coupling coupled to the first port and the third port is applicable, may further determine that coupling the first port to another port of the multiple ports will provide lower data communication latency, and may further provide a notification that indicates that coupling the first port to the other port will provide lower data communication latency. In one or more embodiments, the one or more systems, methods, and/or processes may further determine that the output signal is not detected via the second port of the multiple ports. For example, the other port may be the second port.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1A:
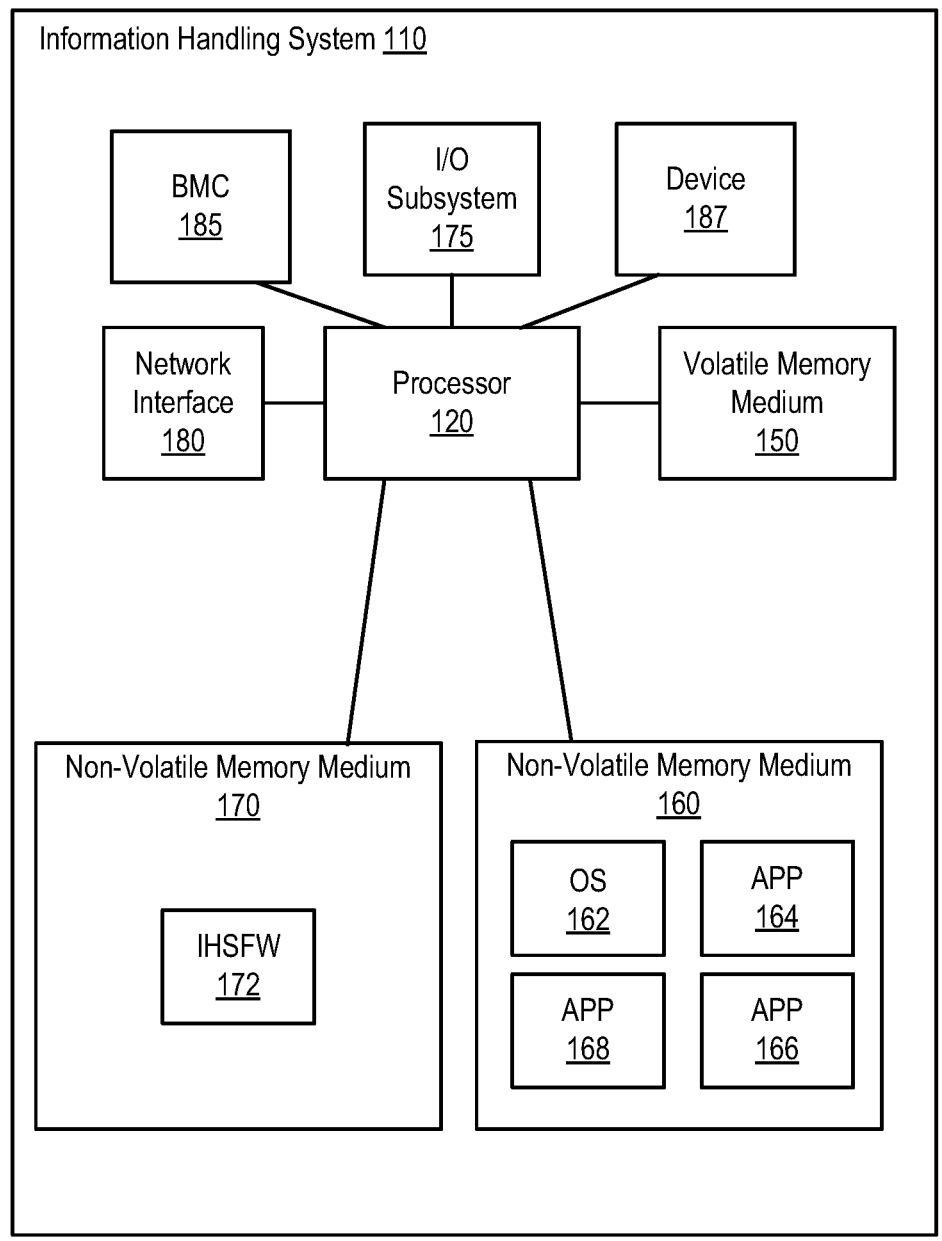
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a planar (e.g., a motherboard) may include multiple ports. For example, a port of a planar may be associated with a Serializer/Deserializer (SerDes) of the planar. For instance, a SerDes may convert data between a serial interface and a parallel interface. In one or more embodiments, a SerDes may be utilized in communicating with a processor. In one example, a device may utilize a SerDes in communicating with a processor. In one instance, the SerDes may include a serial AT attachment (SATA), and a device may utilize SATA in communicating with a processor. In a second instance, the SerDes may include a serial attached SCSI (SAS), and a device may utilize SAS in communicating with a processor. In a third instance, the SerDes may include a universal serial bus (USB), and a device may utilize USB in communicating with a processor. In another instance, the SerDes may include a peripheral component interconnect express (PCIe), and a device may utilize PCIe in communicating with a processor. In another example, a first processor and a second processor may utilize a SerDes in communicating with each other. In one instance, the first processor and the second processor may utilize a low latency cache coherent interlink in communicating with each other. In a second instance, the first processor and the second processor may utilize a QuickPath Interconnect (QPI), available from Intel Corporation, in communicating with each other. In a third instance, the first processor and the second processor may utilize an UltraPath Interconnect (UPI), available from Intel Corporation, in communicating with each other. In a fourth instance, the first processor and the second processor may utilize HyperTransport (HT), available from Advanced Micro Devices, Inc., in communicating with each other. In a fifth instance, the first processor and the second processor may utilize an external global memory interface (xGMI), available from Advanced Micro Devices, Inc., in communicating with each other. In a sixth instance, the first processor and the second processor may utilize a second generation external global memory interface (xGMI2), available from Advanced Micro Devices, Inc., in communicating with each other. In another instance, the first processor and the second processor may utilize Gen-Z Interconnect, available from the Gen-Z Consortium, in communicating with each other.

In one or more embodiments, Gen-Z may provide high-speed, low-latency, memory-semantic access to data and devices via direct-attached, switched or fabric topologies. For example, a Gen-Z fabric may utilize memory-semantic communications in transferring data between memories on different components. For instance, memory-semantic communications may be efficient and/or simple. In one or more embodiments, a Gen-Z component may support up to $2^{64}$ bytes of addressable memory. In one or more embodiments, Gen-Z may support one or more of a co-packaged solution, cache coherency, PCI and PCIe technology, atomic operations, and collective operations, among others. For example, Gen-Z may support multiple topologies, such as co-packages, point-to-point, mesh, and/or switch-based, among others. For instance, Gen-Z may support multi-way memory interleaving across a set of point-to-point and/or switch attached memory components, among others.

In one or more embodiments, one or more processors of an information handling system may utilize non-uniform memory access (NUMA). For example, one or more processors of an information handling system may communicate with a device and/or another processor via NUMA. For instance, SerDes may be utilized in communicating via NUMA. In one or more embodiments, a first processor may request data from storage associated with a second processor. In one example, the first processor may request data from a main memory of the second processor. In another example, the first processor may request data from a device that is associated with direct memory access (DMA) associated with main memory of the second processor.

In one or more embodiments, utilizing a NUMA architecture may provide multiple configurations associated with communicatively coupling a processor to a device and/or communicatively coupling a first processor with a second processor. For example, a media-independent interface (MII) may be utilized in configurations associated with communicatively coupling a processor to a device and/or communicatively coupling a first processor with a second processor. For instance, a MII may be utilized in communicatively coupling a link layer to a PHY (e.g., circuitry that may implement physical layer functions and/or structures).

In one or more embodiments, a MII may be utilized in communicatively coupling a media access controller (MAC) layer to a PHY. For example, utilizing a MII may permit and/or allow communicatively coupling to different physical media without redesigning and/or replacing MAC circuitry. For instance, utilizing a MII may permit and/or allow communicatively coupling any MAC with any PHY, independent of one or more signal transmission media. In one or more embodiments, a MII may utilize one or more data transmission speeds. In one example, a MII may be or include a gigabit media-independent interface (GMII). For instance, GMII may utilize data transfer speeds up to one thousand megabits per second (1000 Mbit/s). In a second example, a MII may be or include a serial gigabit media-independent interface (SGMII). In a third example, a MII may be or include a quad serial gigabit media-independent interface (QSGMII). For instance, a QSGMII may combine four SGMII lines into a five gigabit per second (5 Gbit/s)

interface. In another example, a MII may be or include a ten gigabit per second gigabit (10 Gbit/s) media-independent interface (XGMII).

In one or more embodiments, a cable may be utilized in coupling a first port of a planar to a second port of the planar. For example, ports of the planar may include a universal pin out. For instance, the cable that couples the first port of the planar to the second port of the planar may include a matching and/or complementary universal pin out. In one or more embodiments, with universal pint outs, a first port of a planar may be coupled to a second port of the planar with a cable that may not be adequate to couple the first port to the second port. For example, it may be determined if the cable is or is not adequate to couple the first port to the second port. In one or more embodiments, with universal pint outs, the first port of the planar may be physically coupled to a third port of the planar. For example, even though the first port and the third port are physically coupled, communicatively coupling the first port and the third port may not be possible. For instance, it may be determined if the first port and the third port may be communicatively coupled.

In one or more embodiments, a query signal (e.g., a stimulus signal) may be provided via a port of a planar. For example, other ports of the planar may be monitored for the query signal from the port of the planar. In one instance, it may be determined, based at least on the query signal, if a cable is adequate to couple a first port to a second port. In another instance, it may be it may be determined, based at least on the query signal, if a first port to a second port may be communicatively coupled. In one or more embodiments, if a communication coupling error is determined, information associated with the communication coupling error may be provided. In one example, providing the information associated with the communication coupling error may include logging the information associated with the communication coupling error. In another example, providing the information associated with the communication coupling error may include displaying, via a display, the information associated with the communication coupling error. In one or more embodiments, the information associated with the communication coupling error may indicate that a type of cable may not be utilized to communicatively couple two ports. In one or more embodiments, the information associated with the communication coupling error may indicate that two ports may not be communicatively coupled.

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a volatile memory medium 150, non-volatile memory media 160 and 170, an I/O subsystem 175, a network interface 180, a boot management controller (BMC) 185, and a device 187. As illustrated, volatile memory medium 150, non-volatile memory media 160 and 170, I/O subsystem 175, network interface 180, BMC 185, and device 187 may be communicatively coupled to processor 120.

In one or more embodiments, one or more of volatile memory medium 150, non-volatile memory media 160 and 170, I/O subsystem 175, network interface 180, BMC 185, and device 187 may be communicatively coupled to processor 120 via one or more buses, one or more switches, and/or one or more root complexes, among others. In one example, one or more of volatile memory medium 150, non-volatile memory media 160 and 170, I/O subsystem 175, and network interface 180 may be communicatively coupled to processor 120 via one or more PCI-Express (PCIe) root complexes. In another example, one or more of an I/O subsystem 175 and a network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network.

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing one or more systems, one or more flowcharts, one or more methods, and/or one or more processes described herein. In one example, processor 120 may execute processor instructions from one or more of memory media 150-170 in implementing one or more systems, one or more flowcharts, one or more methods, and/or one or more processes described herein. In another example, processor 120 may execute processor instructions via network interface 180 in implementing one or more systems, one or more flowcharts, one or more methods, and/or one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150-170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, BMC 185 may be or include a remote access controller. For example, the remote access controller may be or include a Dell Remote Access Controller (DRAC). In one or more embodiments, a remote access controller may be integrated into IHS 110. For example, the remote access controller may be or include an integrated Dell Remote Access Controller (iDRAC). In one or more embodiments, a remote access controller may include one or more of a processor, and a memory, a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. For example, the remote access controller may be based at least on an Intelligent Platform Management Interface (IPMI) standard. For instance, the remote access controller may allow and/or permit utilization of IPMI out-of-band interfaces such as IPMI Over LAN (local area network). In one or more embodiments, a remote access controller may include and/or provide one or more internal private networks. For example, the remote access controller may include and/or provide one or more of an Ethernet interface, a front panel USB interface, and a Wi-Fi interface, among others.

In one or more embodiments, BMC 185 may be or include a microcontroller. For example, the microcontroller may be or include an 8051 microcontroller, an ARM Cortex-M (e.g., Cortex-M0, Cortex-M0+, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, BMC 185 may be or include one or more of a field programmable gate array (FPGA) and an ASIC, among others, configured, coded, and/or encoded with instructions in accordance with one or more of systems, one or more flowcharts, one or more methods, and/or one or more processes described herein.

In one or more embodiments, device 187 may be or include a programmable logic device. In one example, device 187 may be or include a FPGA. In another example, device 187 may be or include a complex programmable logic device (CPLD). For instance, a CPLD may include one or more structures and/or functionalities of a FPGA and/or one or more structures and/or functionalities of a programmable array logic (PAL), among others. In one or more embodiments, device 187 may be or include an ASIC. Although not specifically illustrated, BMC 185 may include device 187, according to one or more embodiments. In one or more embodiments, device 187 may be configured to implement one or more systems, one or more flowcharts, one or more methods, and/or one or more processes described herein.

In one or more embodiments, processor 120 and one or more components of IHS 110 may be included in a system-on-chip (SoC). For example, the SoC may include processor 120 and a platform controller hub (not specifically illustrated).

Figure 1B:
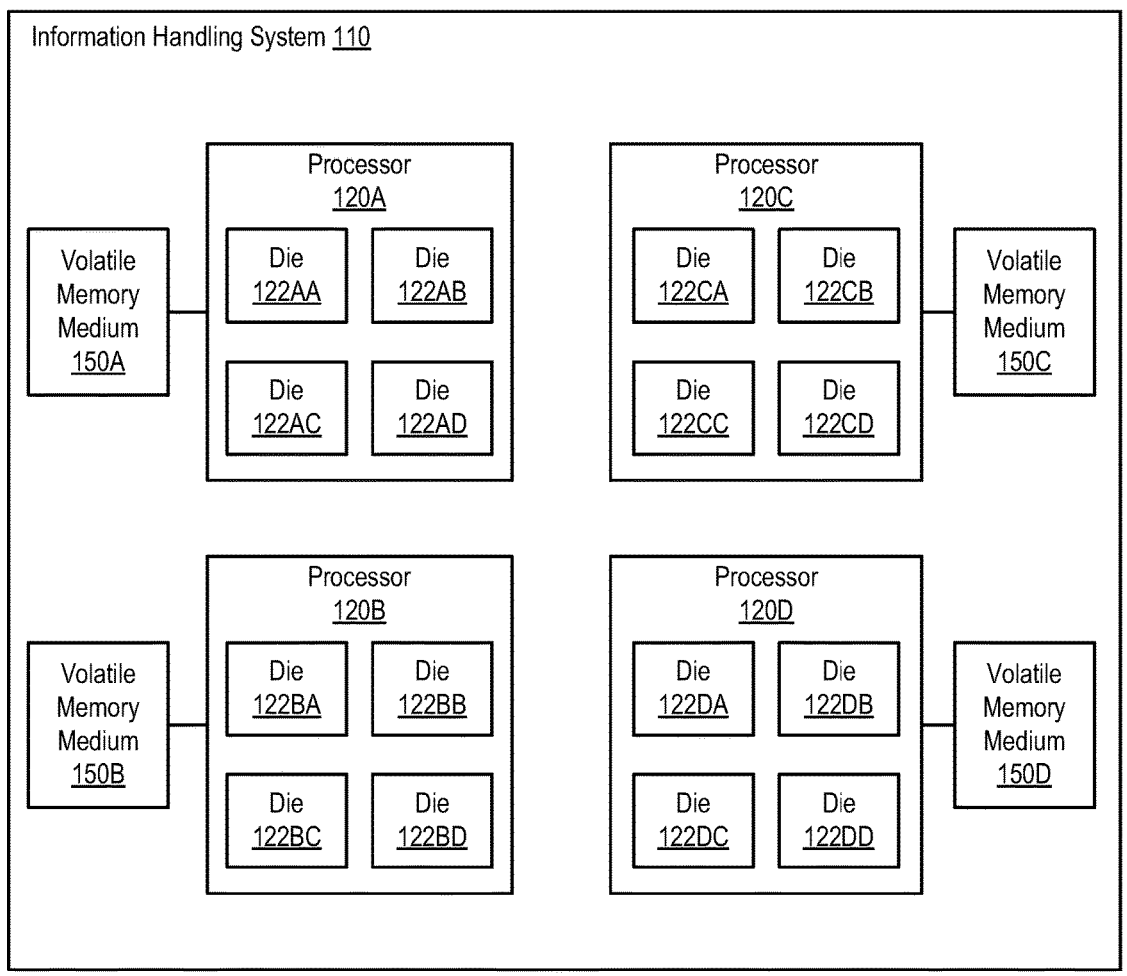
FIG. 1B illustrates a second example of an information handling system, according to one or more embodiments.

Turning now to FIG. 1B, a second example of an information handling system is illustrated, according to one or more embodiments. As shown, IHS 110 may include processors 120A-120D. In one or more embodiments, a processor 120 may include multiple dies 122. As illustrated, a processor 120A may include dies 122AA-122AD, a processor 120B may include dies 122BA-122BD, a processor 120C may include dies 122CA-122CD, and a processor 120D may include dies 122DA-122DD. In one or more embodiments, a die 122 may include multiple processor cores. As shown, processors 120A-120D may be coupled to volatile memory media 150A-150D, respectively. In one or more embodiments, volatile memory medium 150 may be or include main memory for processor 120. Although not specifically illustrated, device 187 may be coupled to processors 120A-120D.

Figure 1C:
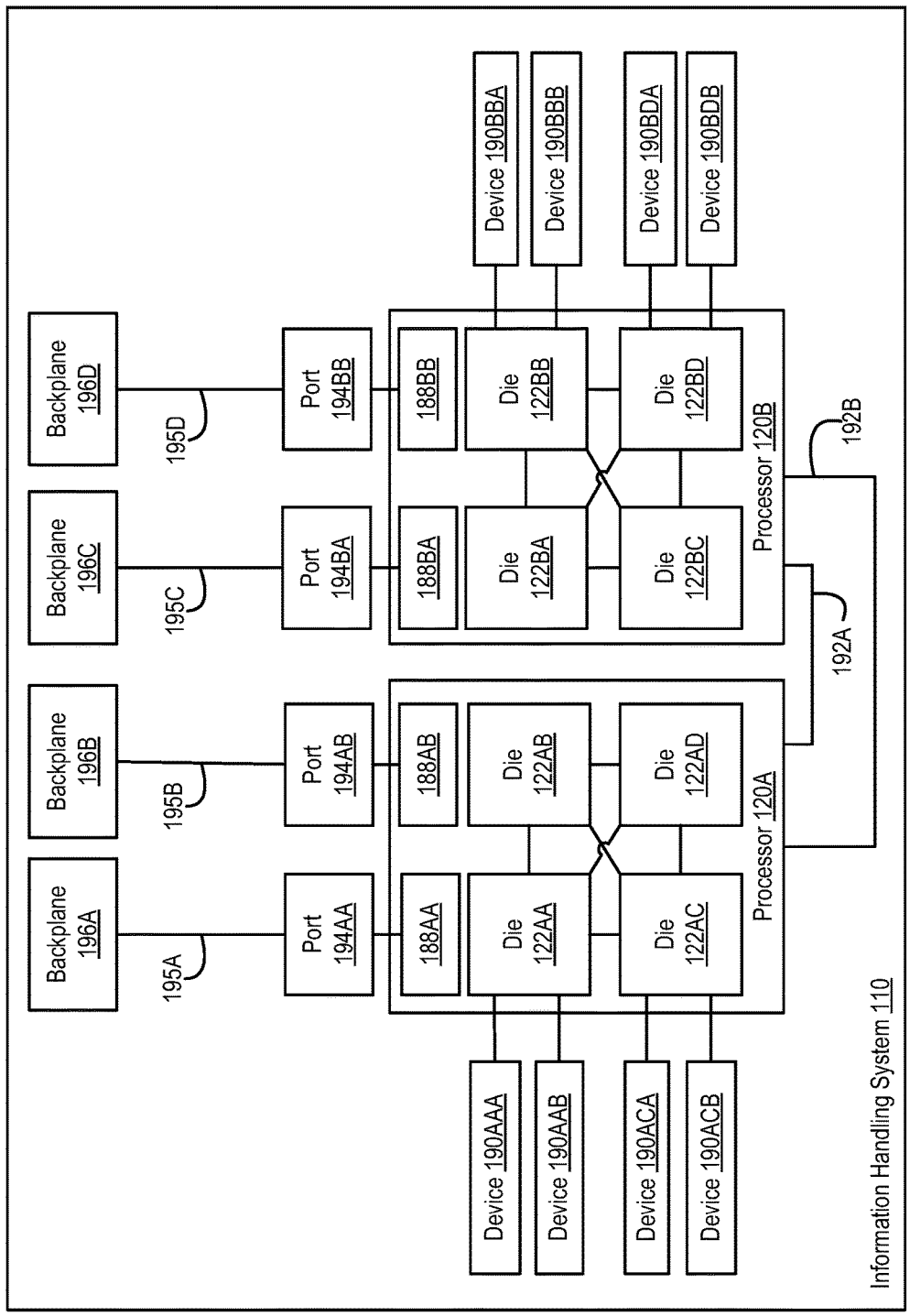
FIG. 1C illustrates a third example of an information handling system, according to one or more embodiments.

Turning now to FIG. 1C, a third example of an information handling system is illustrated, according to one or more embodiments. As shown, devices 190AAA and 190AAB may be coupled to die 122AA. As illustrated, devices 190ACA and 190ACB may be coupled to die 122AC. As shown, devices 190BBA and 190BBB may be coupled to die 122BB. As illustrated, devices 190BDA and 190BDB may be coupled to die 122BD. In one example, a device 190 may be or include a PCIe device. In a second example, a device 190 may be or include a host bus adapter (HBA) device. In third example, a device 190 may be or include storage. In another example, a device 190 may be or include a graphics processing unit. Although not specifically illustrated, other devices 190 may be coupled to one or more of dies 122AB, 122AD, 122BA, and 122AD, according to one or more embodiments.

As shown, processors 120A and 120B may be coupled to one another via a coupling 192A. As illustrated, processors 120A and 120B may be coupled to one another via a coupling 192B. In one or more embodiments, processors 120A and 120B may communicate with one another via one or more of couplings 192A and 192B. In one example, a die of dies 122AA-122AD may communicate with a die of dies 122BA-122BD via one or more of couplings 192A and 192B. In one instance, a die of dies 122AA-122AD may access one or more of devices 190BBA, 190BBB, 190BDA, and 190BDB, among others, via one or more of couplings 192A and 192B. In another instance, a die of dies 122AA-122AD may access volatile memory medium 150B via one or more of couplings 192A and 192B. In another example, a die of dies 122BA-122BD may communicate with a die of dies 122AA-122AD via one or more of couplings 192A and 192B. In one instance, a die of dies 122BA-122BD may access one or more of devices 190AAA, 190AAB, 190ACA, and 190ACB, among others, via one or more of couplings 192A and 192B. In another instance, a die of dies 122BA-122BD may access volatile memory medium 150A via one or more of couplings 192A and 192B.

As shown, processor 120A may be coupled to ports 194AA and 194AB. In one example, a Ser/Des 188AA may be coupled to port 194AA. In another example, a Ser/Des 188AB may be coupled to port 194AB. As illustrated, processor 120B may be coupled to ports 194BA and 194BB. In one example, a Ser/Des 188BA may be coupled to port 194BA. In another example, a Ser/Des 188BB may be coupled to port 194BB.

In one or more embodiments, port 194 may be configured to be utilized with multiple interfaces. In one example, port 194 may be configured to be utilized with a PCIe interface. In a second example, port 194 may be configured to be utilized with a SATA interface. In a third example, port 194 may be configured to be utilized with a USB interface. In another example, port 194 may be configured to be utilized with a MII interface. For instance, port 194 may be configured to be utilized with a XGMII interface. In one or more embodiments, port 194 may include a universal pin out. For example, port 194 may be or include a SlimLine connector, available from 3M Company.

As shown, port 194AA may be coupled to a backplane 196A via a coupling 195A. As illustrated, port 194AB may be coupled to a backplane 196B via a coupling 195B. As shown, port 194BA may be coupled to a backplane 196C via a coupling 195C. As illustrated, port 194BB may be coupled to a backplane 196D via a coupling 195D. In one or more embodiments, coupling 195 may be or include a cable assembly. For example, coupling 195 may be or include a SlimLine twin axial cable assembly, available from 3M Company. In one or more embodiments, coupling 195 may be associated with a type of coupling. In one example, a type of coupling may be or include an USB coupling. In a second example, a type of coupling may be or include a SAS coupling. In a third example, a type of coupling may be or include a SATA coupling. In another example, a type of coupling may be or include a PCIe coupling.

Figure 1D:
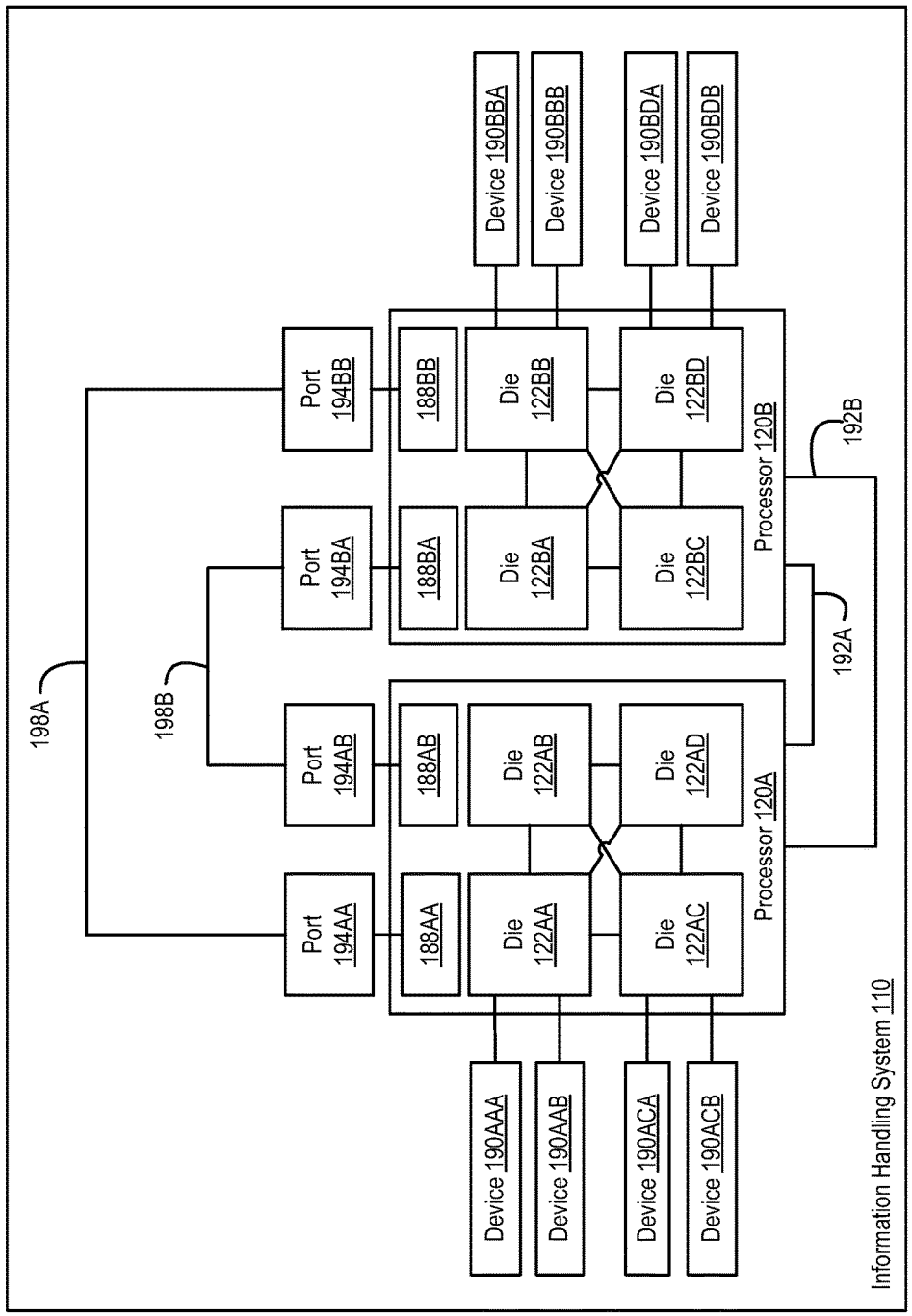
FIG. 1D illustrates a fourth example of an information handling system, according to one or more embodiments.

Turning now to FIG. 1D, a fourth example of an information handling system is illustrated, according to one or more embodiments. As shown, ports 194AA and 194BB may be coupled via a coupling 198A. As illustrated, ports 194AB and 194BA may be coupled via a coupling 198B. In one or more embodiments, coupling 198 may be or include a XGMII cable. In one or more embodiments, coupling 198 may be or include a loopback cable. For example, a loopback cable may include one or more crossover elements.

In one or more embodiments, processors 120A and 120B may communicate with one another via one or more of couplings 198A and 198B. In one example, a die of dies 122AA-122AD may communicate with a die of dies 122BA-122BD via one or more of couplings 198A and 198B. In one instance, a die of dies 122AA-122AD may access one or more of devices 190BBA, 190BBB, 190BDA, and 190BDB, among others, via one or more of couplings 198A and 198B. In another instance, a die of dies 122AA-122AD may access volatile memory medium 150B via one or more of couplings 198A and 198B. In another example, a die of dies 122BA-122BD may communicate with a die of dies 122AA-122AD via one or more of couplings 198A and 198B. In one instance, a die of dies 122BA-122BD may access one or more of devices 190AAA, 190AAB, 190ACA, and 190ACB, among others, via one or more of couplings 198A and 198B. In another instance, a die of dies 122BA-122BD may access volatile memory medium 150A via one or more of couplings 198A and 198B.

In one or more embodiments, coupling 198 may be or include a cable assembly. For example, coupling 198 may be or include a SlimLine twin axial cable assembly, available from 3M Company. In one or more embodiments, coupling 198 may be associated with a type of coupling. In one example, a type of coupling may be or include an USB coupling. In a second example, a type of coupling may be or include a SAS coupling. In a third example, a type of coupling may be or include a SATA coupling. In a fourth example, a type of coupling may be or include a PCIe coupling. In another example, a type of coupling may be or include a MII coupling. For instance, a MII coupling may be or include a XGMII coupling. In one or more embodiments, coupling 198 may be associated with one or more properties. For example, the one or more properties may be associated with one or more applications. For instance, the one or more applications may include one or more of a PCIe application, a SATA application, a USB application, and a MII application, among others.

Figure 1E:
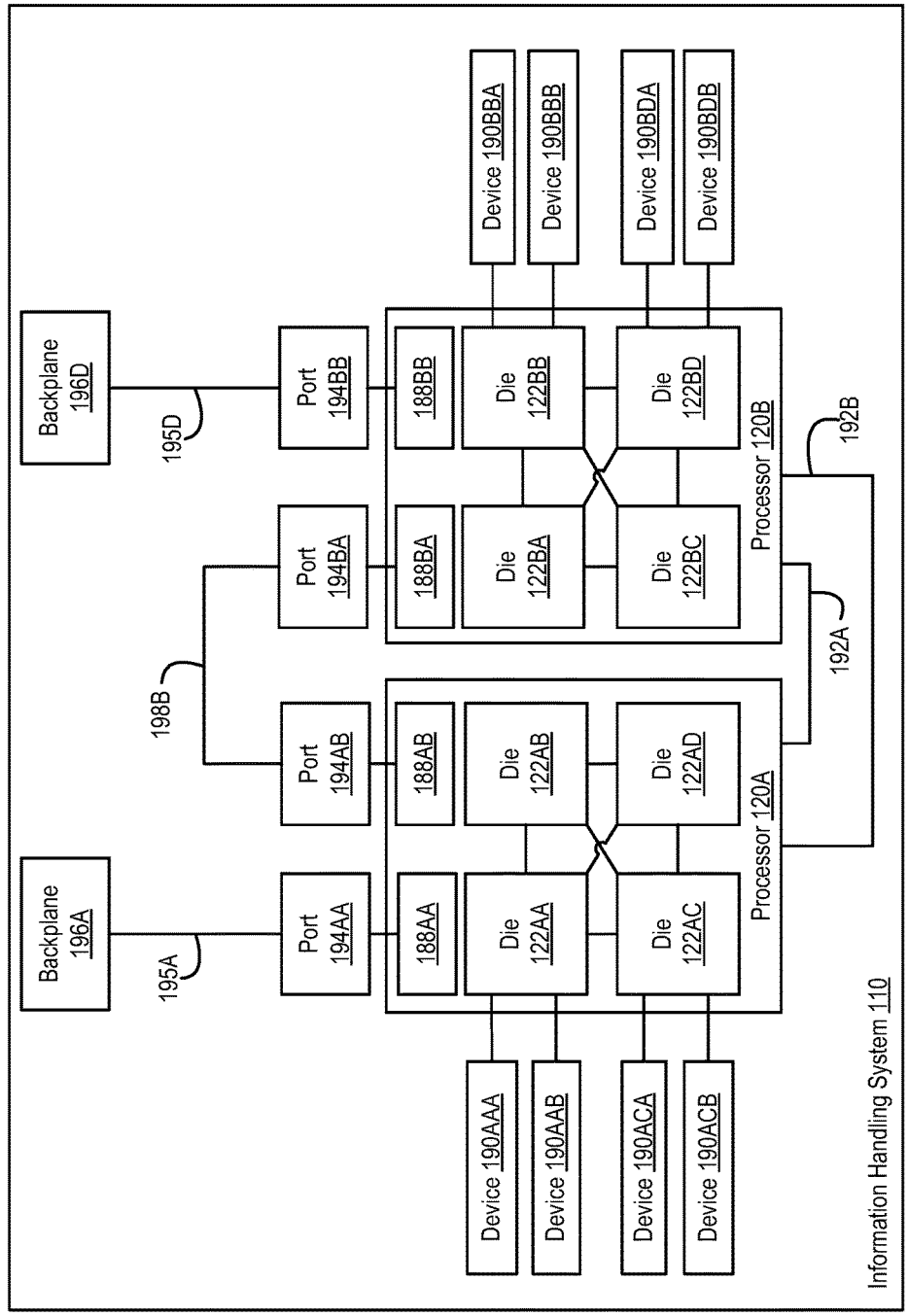
FIG. 1E illustrates a fifth example of an information handling system, according to one or more embodiments.

Turning now to FIG. 1E, a fifth example of an information handling system is illustrated, according to one or more embodiments. As shown, ports 194AB and 194BA may be coupled via a coupling 198B. As illustrated, ports 194AA and 194BB may be coupled to respective backplanes 196A and 196D via respective couplings 195A and 195D. In one or more embodiments, processors 120A and 120B may communicate with one another via coupling 198B. In one example, a die of dies 122AA-122AD may communicate with a die of dies 122BA-122BD via coupling 198B. In one instance, a die of dies 122AA-122AD may access one or more of devices 190BBA, 190BBB, 190BDA, and 190BDB, among others, via coupling 198B. In another instance, a die of dies 122AA-122AD may access volatile memory medium 150B via coupling 198B. In another example, a die of dies 122BA-122BD may communicate with a die of dies 122AA-122AD via coupling 198B. In one instance, a die of dies 122BA-122BD may access one or more of devices 190AAA, 190AAB, 190ACA, and 190ACB, among others, via coupling 198B. In another instance, a die of dies 122BA-122BD may access volatile memory medium 150A via coupling 198B.

Figure 1F:
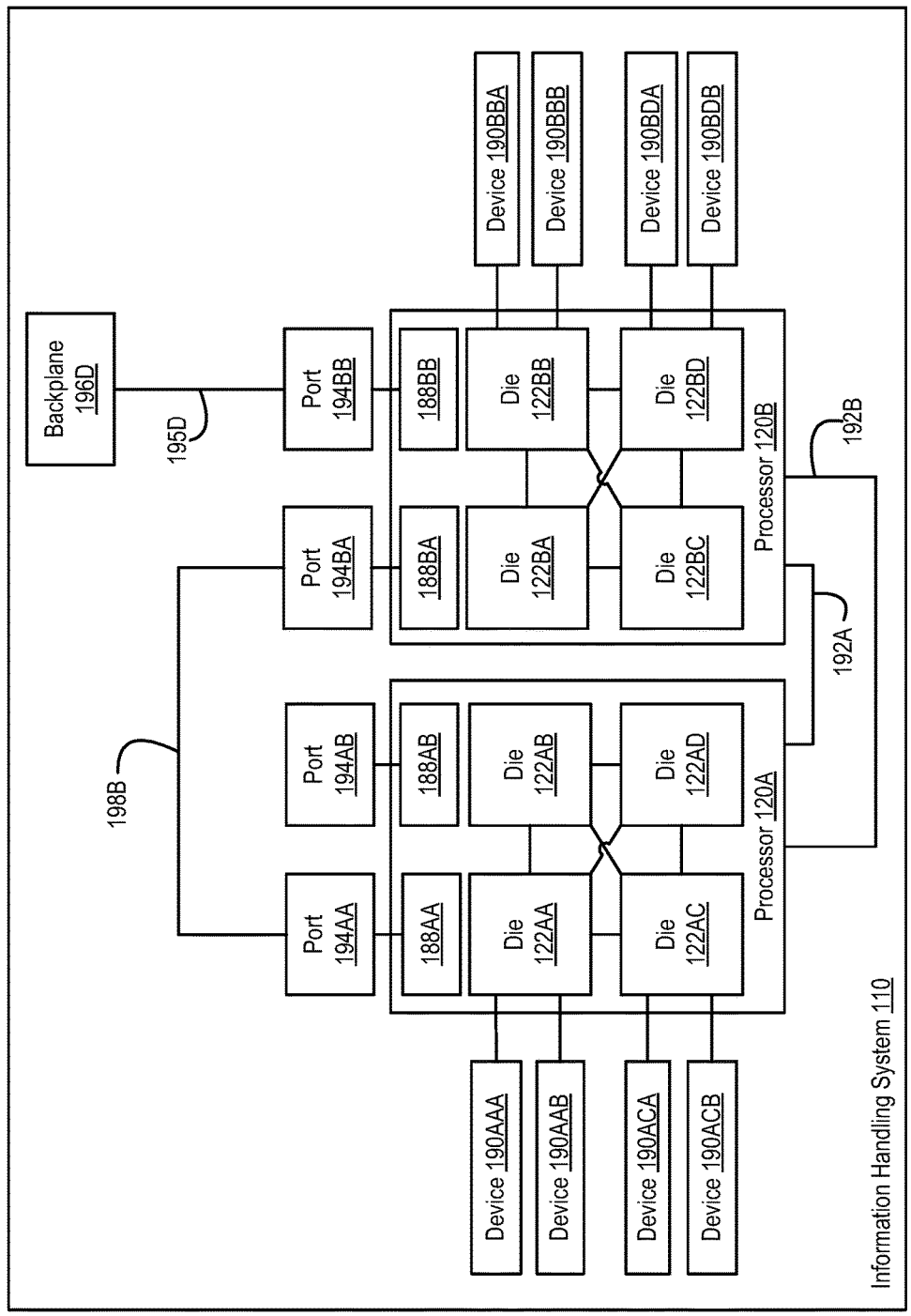
FIG. 1F illustrates a sixth example of an information handling system, according to one or more embodiments.

Turning now to FIG. 1F, a sixth example of an information handling system is illustrated, according to one or more embodiments. As shown, port 194AA and 194BA may be coupled via coupling 198B. As illustrated, port 194BB may be coupled to backplane 196D via coupling 195D. In one or more embodiments, it may be determined that port 194AB is not coupled to another port and is not coupled to a backplane. In one example, IHSFW 172 may determine that port 194AB is not coupled to another port and is not coupled to a backplane. In a second example, BMC 185 may determine that port 194AB is not coupled to another port and is not coupled to a backplane. In another example, device 187 may determine that port 194AB is not coupled to another port and is not coupled to a backplane.

In one or more embodiments, it may be determined that port 194AA is coupled to port 194BA. In one example, IHSFW 172 may determine that port 194AA is coupled to port 194BA. In a second example, BMC 185 may determine that port 194AA is coupled to port 194BA. In another example, device 187 may determine that port 194AA is coupled to port 194BA. In one or more embodiments, it may be determined that coupling port 194AB may be coupled to port 194BA. In one example, coupling ports 194AB and 194BA may provide a higher communication rate than coupling ports 194AA and 194BA. For instance, providing a higher data rate by coupling ports 194AB and 194BA may permit and/or allow IHS 110 to function more efficiently and/or to process more data in an amount of time. In another example, coupling ports 194AB and 194BA may provide a lower provide lower data communication latency than coupling ports 194AA and 194BA. For instance, providing a lower data communication latency by coupling ports 194AB and 194BA may permit and/or allow IHS 110 to function more efficiently and/or to process more data in an amount of time.

In one or more embodiments, a notification that indicates that ports 194AB and 194BA could be coupled and/or should be coupled may be provided. For example, the notification may be provided to an administrator (e.g., a user) of IHS 110. In one instance, the notification may indicate that coupling ports 194AB and 194BA may provide a higher communication rate than coupling ports 194AA and 194BA. In another instance, the notification may indicate that coupling ports 194AB and 194BA may provide a lower data communication latency than coupling ports 194AA and

194BA. In one or more embodiments, one or more of IHSFW 172, BMC 185, and device 187 may be utilized in providing the notification.

In one or more embodiments, it may be determined that coupling ports 194AA and 194BA is erroneous. For example, one or more of IHSFW 172, BMC 185, and device 187 may be utilized in determining that coupling ports 194AA and 194BA is erroneous. In one or more embodiments, a notification, that indicates that coupling ports 194AA and 194BA is erroneous, may be provided. For example, the notification may be provided to an administrator (e.g., a user) of IHS 110. In one or more embodiments, one or more of IHSFW 172, BMC 185, and device 187 may be utilized in providing the notification.

Figure 1G:
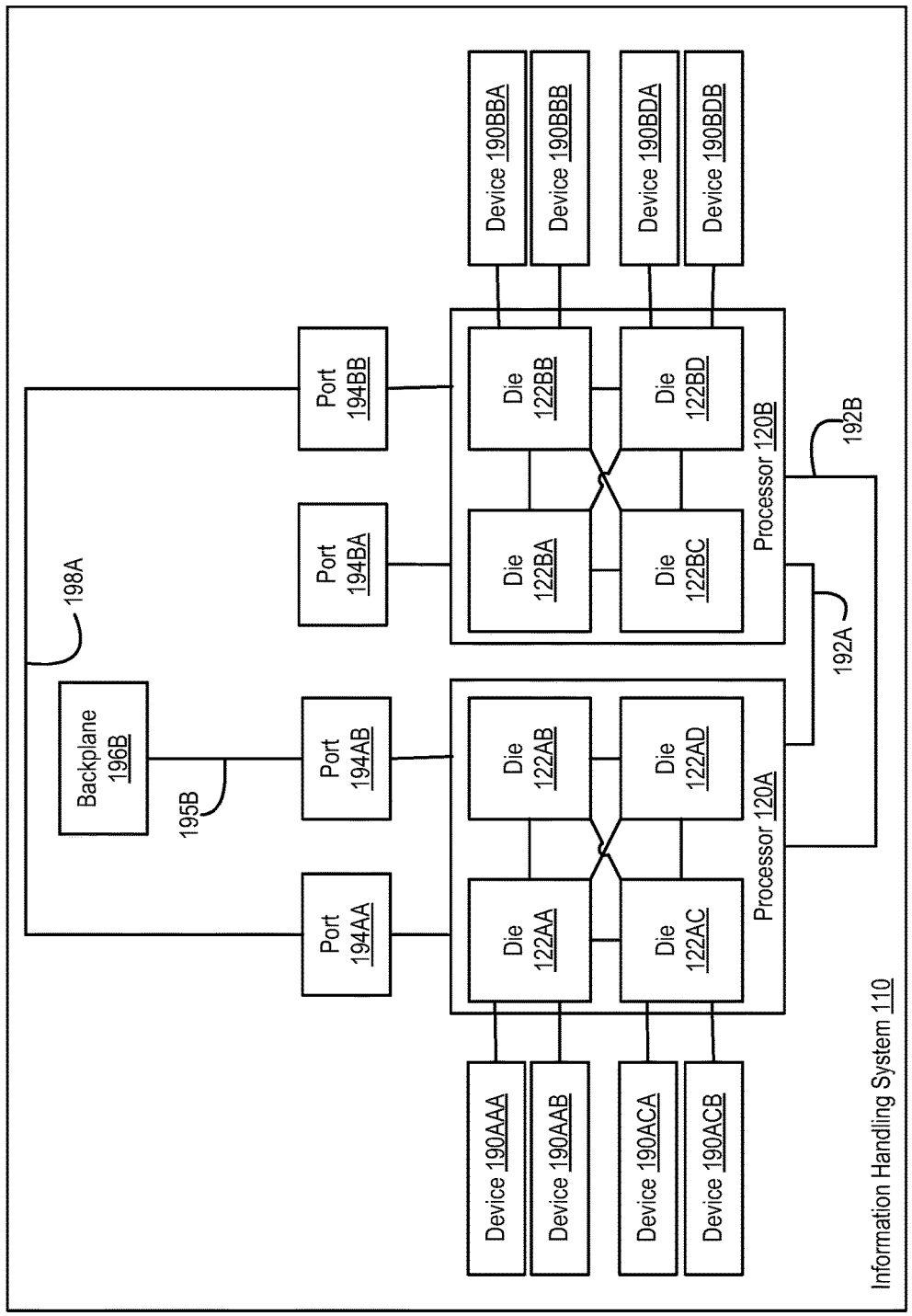
FIG. 1G illustrates a seventh example of an information handling system, according to one or more embodiments.

Turning now to FIG. 1G, a seventh example of an information handling system is illustrated, according to one or more embodiments. As shown, ports 194AA and 194BB may be coupled via coupling 198A. As illustrated, port 194AB may be coupled to backplane 196B via coupling 195B. In one or more embodiments, it may be determined that port 194BA is not coupled to another port and is not coupled to a backplane. In one example, IHSFW 172 may determine that port 194BA is not coupled to another port and is not coupled to a backplane. In a second example, BMC 185 may determine that port 194BA is not coupled to another port and is not coupled to a backplane. In another example, device 187 may determine that port 194BA is not coupled to another port and is not coupled to a backplane.

In one or more embodiments, it may be determined that backplane 196B may be coupled to another port and that ports 194AB and 194BA may be coupled. In one example, coupling ports 194AB and 194BA may provide a higher communication rate than coupling ports 194AA and 194BA. For instance, providing a higher data rate by coupling ports 194AB and 194BA may permit and/or allow IHS 110 to function more efficiently and/or to process more data in an amount of time. In a second example, coupling ports 194AB and 194BA may provide a lower data communication latency than coupling ports 194AA and 194BA. For instance, providing a lower data communication latency by coupling ports 194AB and 194BA may permit and/or allow IHS 110 to function more efficiently and/or to process more data in an amount of time. In another example, backplane 196B may be coupled port 194AA. For instance, backplane 196B may be coupled port 194AA so that port 194AB may be coupled to port 194BA.

In one or more embodiments, a notification that indicates that ports 194AB and 194BA could be coupled and/or should be coupled may be provided. For example, the notification may be provided to an administrator (e.g., a user) of IHS 110. In one instance, the notification may indicate that coupling ports 194AB and 194BA may provide a higher communication rate than coupling ports 194AA and 194BA. In another instance, the notification may indicate that coupling ports 194AB and 194BA may provide a lower data communication latency than coupling ports 194AA and 194BA. In one or more embodiments, one or more of IHSFW 172, BMC 185, and device 187 may be utilized in providing the notification.

In one or more embodiments, a notification that indicates that backplane 196B could be coupled and/or should be coupled to port 194AA may be provided. For example, the notification may be provided to an administrator (e.g., a user) of IHS 110. In one or more embodiments, one or more of IHSFW 172, BMC 185, and device 187 may be utilized in providing the notification. In one or more embodiments, coupling 198A may be utilized in coupling ports 194AB and 194BA. In one or more embodiments, coupling 198B may be utilized in coupling ports 194AB and 194BA. In one example, coupling 198B may provide a higher communication rate than coupling 198A. For instance, coupling 198B may be shorter than coupling 198A. In another example, coupling 198B may provide a lower data communication latency than coupling 198A. For instance, coupling 198B may be shorter than coupling 198A.

Figure 1H:
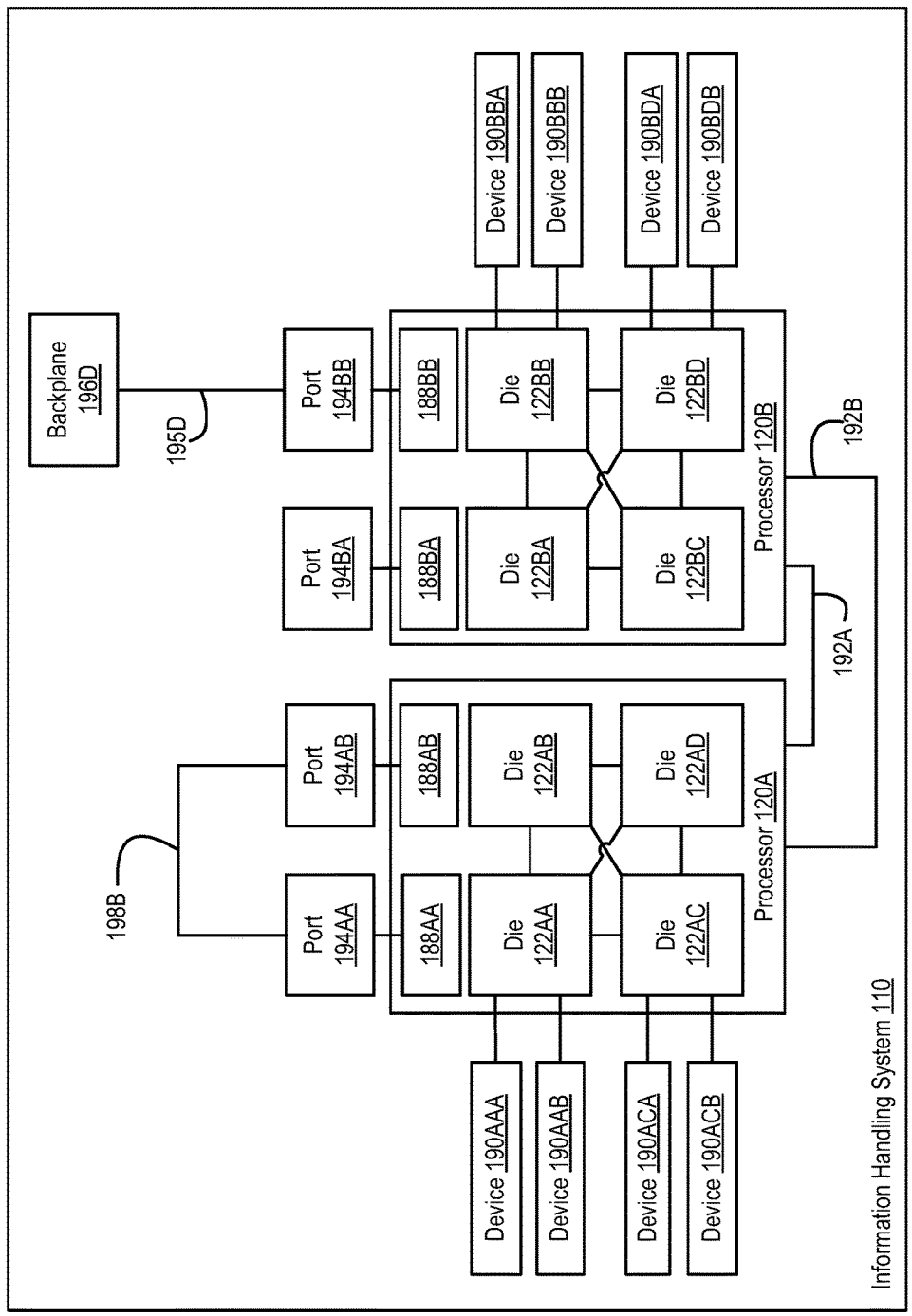
FIG. 1H illustrates an eighth example of an information handling system, according to one or more embodiments.

Turning now to FIG. 1H, an eighth example of an information handling system is illustrated, according to one or more embodiments. As shown, ports 194AA and 194AB may be coupled. As illustrated, backplane 196D may be coupled to port 194BB via coupling 195D. In one or more embodiments, it may be determined that coupling ports 194AA and 194AB is erroneous. For example, one or more of IHSFW 172, BMC 185, and device 187 may be utilized in determining that coupling ports 194AA and 194AB is erroneous. In one or more embodiments, a notification, that indicates that coupling ports 194AA and 194AB is erroneous, may be provided. For example, the notification may be provided to an administrator (e.g., a user) of IHS 110. In one or more embodiments, one or more of IHSFW 172, BMC 185, and device 187 may be utilized in providing the notification.

Figure 1I:
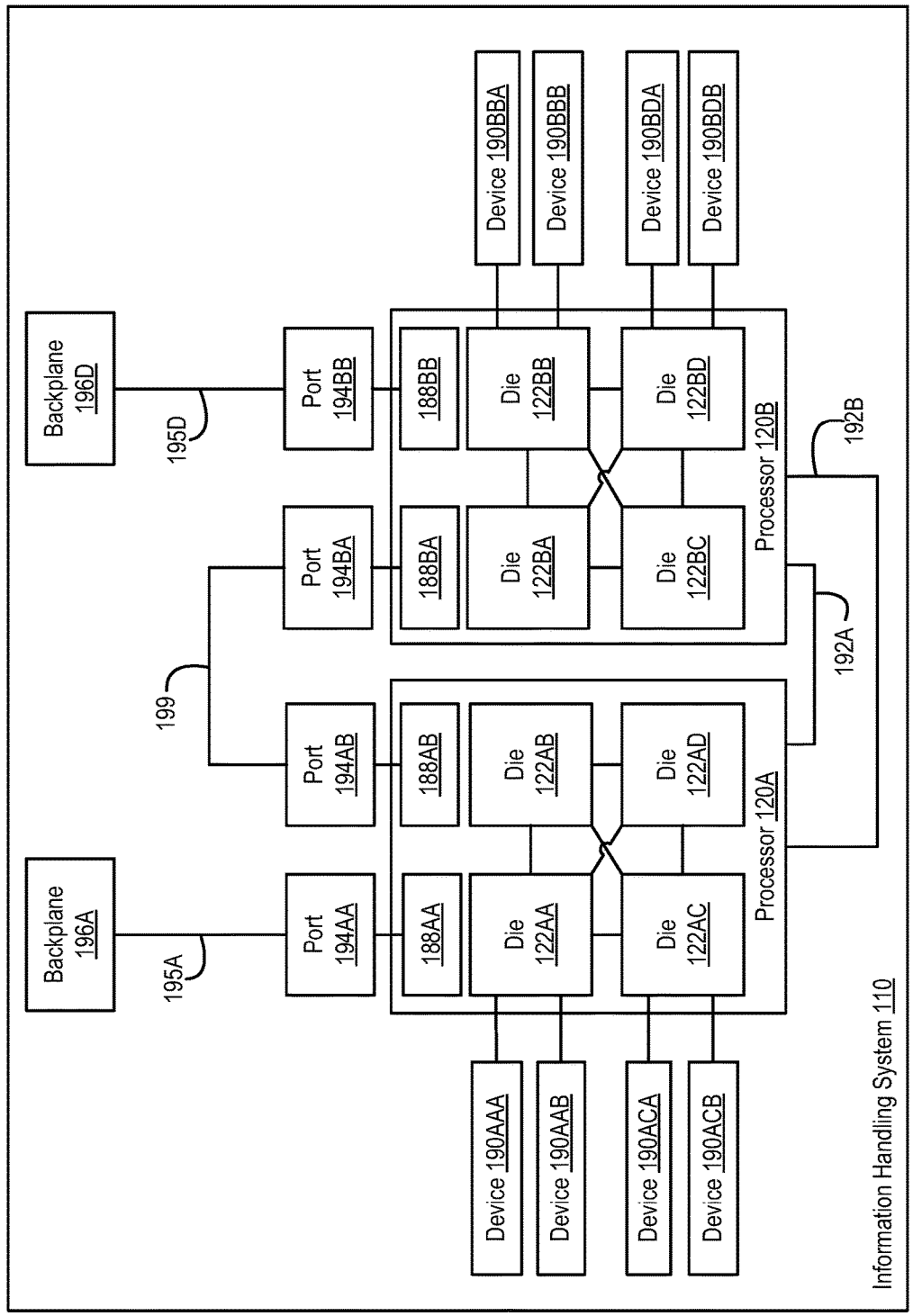
FIG. 1I illustrates a ninth example of an information handling system, according to one or more embodiments.

Turning now to FIG. 1I, a ninth example of an information handling system is illustrated, according to one or more embodiments. As shown, backplane 196A may be coupled to port 194AA via coupling 195A. As illustrated, backplane 196D may be coupled to port 194BB via coupling 195D. As shown, ports 194AB and 194BA may be coupled via a coupling 199. In one or more embodiments, it may be determined that coupling 199 is erroneous. For example, one or more of IHSFW 172, BMC 185, and device 187 may be utilized in determining that coupling 199 is erroneous. For instance, coupling 199 may not be utilized in coupling ports 194AB and 194BA. In one or more embodiments, it may be determined that coupling 199 is associated with an incorrect type of a coupling. For example, coupling 199 may be or include a cable assembly. For instance, the cable assembly of coupling 199 may not be correct, may not be appropriate, and/or may not be applicable in coupling ports 194AB and 194BA. In one or more embodiments, coupling 199 may not be or may not include a loopback cable. In one or more embodiments, a notification, that indicates that coupling ports 194AA and 194AB is erroneous, may be provided. For example, the notification may be provided to an administrator (e.g., a user) of IHS 110. In one or more embodiments, one or more of IHSFW 172, BMC 185, and device 187 may be utilized in providing the notification. In one or more embodiments, the notification may include information that may indicate that coupling 199 is not applicable.

Figure 1J:
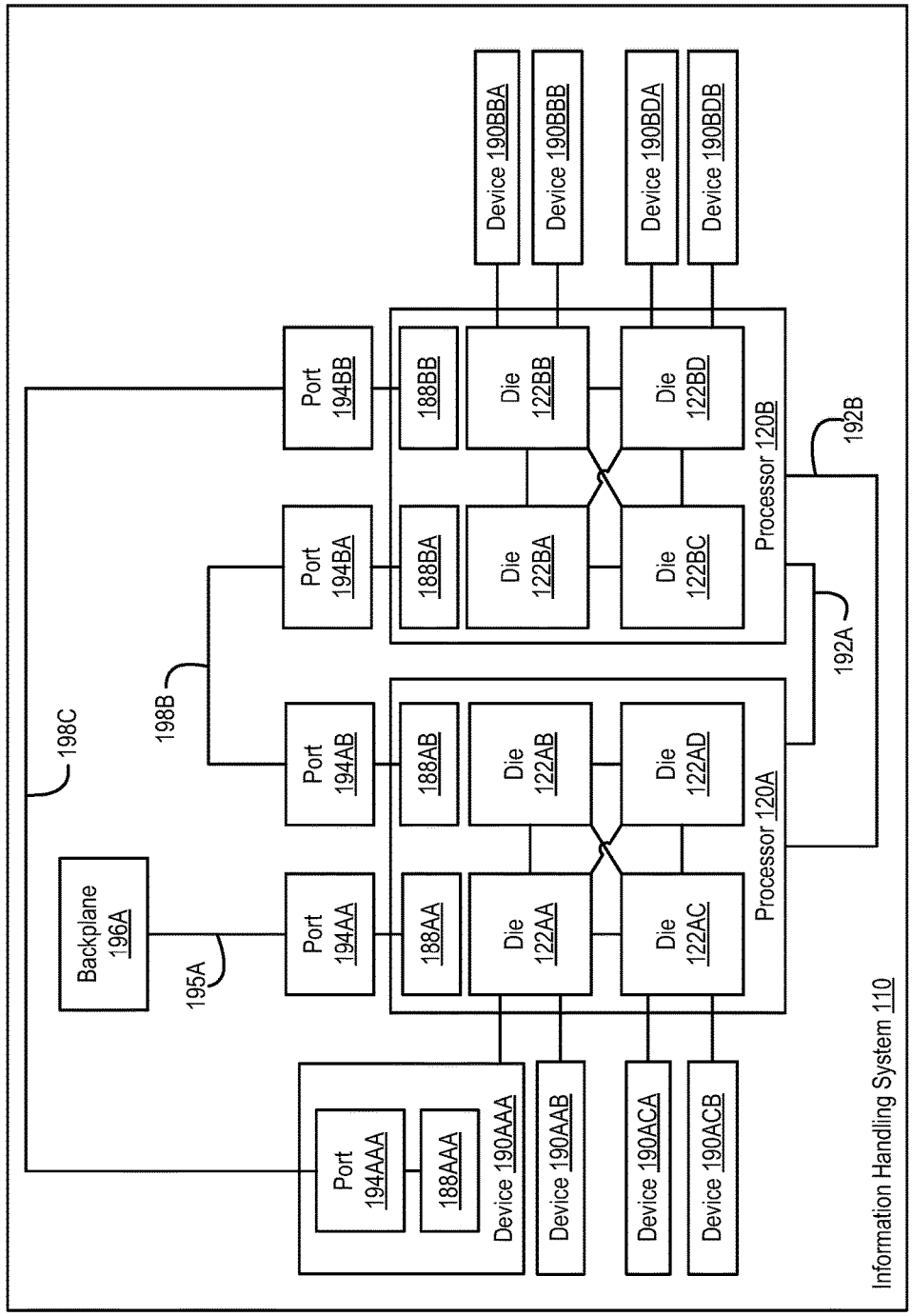
FIG. 1J illustrates another example of an information handling system, according to one or more embodiments.

Turning now to FIG. 1J, another example of an information handling system is illustrated, according to one or more embodiments. As shown, device 190AAA may include a SerDes 188AAA and a port 194AAA. As illustrated, SerDes 188AAA may be coupled to port 194AAA. As shown, ports 194AAA and 194BB may be coupled via a coupling 198C. In one or more embodiments, it may be determined that port 194BB is coupled to port 194AAA. In one example, IHSFW 172 may determine that port 194BB is coupled to port 194AAA. In a second example, BMC 185 may determine that port 194BB is coupled to port 194AAA. In another example, device 187 may determine that port 194BB is coupled to port 194AAA.

In one or more embodiments, coupling ports 194AAA and 194BB may provide processor 120B a higher communication rate to device 190AAA than utilizing one or more of couplings 192A, 192B, and 198B and/or processor 120A to communicate with device 190AAA. For example, providing a higher data rate by coupling ports 194AAA and 194BB may permit and/or allow IHS 110 to function more efficiently and/or to process more data in an amount of time. In one or more embodiments, coupling ports 194AAA and 194BB may provide processor 120B a lower provide lower data communication latency to device 190AAA than utilizing one or more of couplings 192A, 192B, and 198B and/or processor 120A to communicate with device 190AAA. For example, providing a lower data communication latency by coupling ports 194AAA and 194BB may permit and/or allow IHS 110 to function more efficiently and/or to process more data in an amount of time.

Figure 2A:
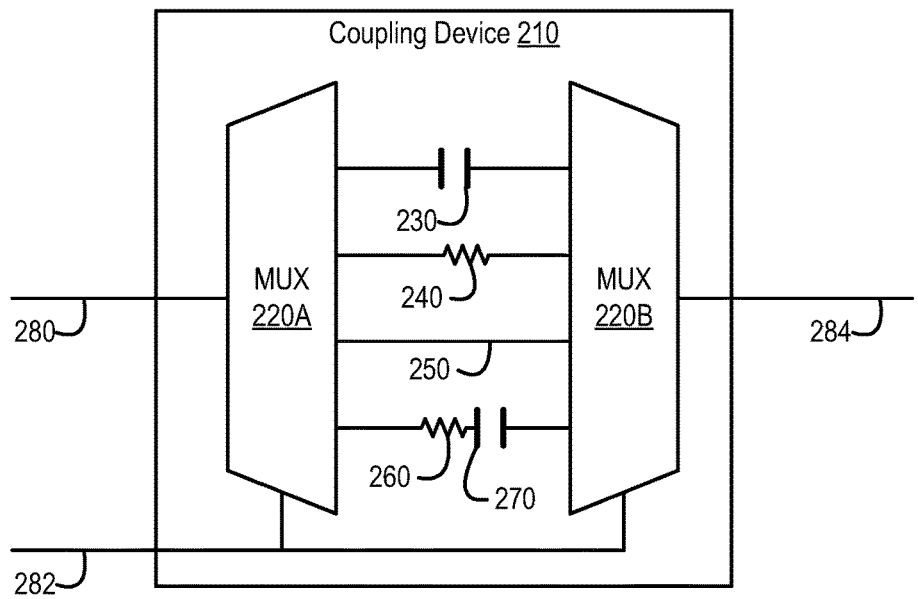
FIG. 2A illustrates an example of a coupling device, according to one or more embodiments.

Turning now to FIG. 2A, an example of a coupling device is illustrated, according to one or more embodiments. As shown, a coupling device 210 may include multiplexers (MUXes) 220A and 220B. In one or more embodiments, a SerDes may be coupled to a coupling 280. As illustrated, coupling 280 may be coupled to multiplexer (MUX) 220A. In one or more embodiments, a port 194 may be coupled to a coupling 284. As shown, coupling 284 may be coupled to MUX 220B. In one or more embodiments, MUXes 220A and 220B may be controlled via a control coupling 282. For example, one or more of processor 120 IHSFW 172, BMC 185, and device 187 may be utilized in controlling MUXes 220A and 220B via coupling 282.

In one or more embodiments, a reactive load, a resistive load, no load, or a combination of a resistive and a reactive load may introduced to a signal path. For example, coupling device 210 may introduce a reactive load, a resistive load, no load, or a combination of a resistive and a reactive load to a signal path of a SerDes and a port 194. For instance, coupling 282 may be utilized in selecting a reactive load, a resistive load, no load, or a combination of a resistive and a reactive load that may be introduced to a signal path. As illustrated, a reactive load may include a capacitor 230. As shown, a resistive load may include a resistor 240. As illustrated, no load may include a coupling 250. In one example, coupling 250 may be or include a conductor. In another example, coupling 250 may be or include a semiconductor. As shown, a combination of a resistive and a reactive load may include a resistor 260 and a capacitor 270.

In one or more embodiments, coupling a pin of port 194 in a DC fashion may include utilizing resistor 240 or may include utilizing coupling 250. In one or more embodiments, coupling a pin of port 194 in a DC fashion may include utilizing capacitor 230 or may include utilizing resistor 260 and capacitor 270.

In one or more embodiments, a signal path may associated with a conductive pin of a port 194. In one example, coupling device 210 may be utilized to match an impedance associated with a pin of a port 194. In a second example, coupling device 210 may be utilized to couple a pin of a port 194 in a direct current (DC) fashion. In one instance, a pin of a port 194 may be associated with a SAS coupling, which may be coupled in a DC fashion. In another instance, a pin of a port 194 may be associated with a SATA coupling, which may be coupled in a DC fashion. In another example, coupling device 210 may be utilized to couple a pin of a port 194 in an alternating current (AC) fashion. In one instance, a pin of a port 194 may be associated with a MII coupling, which may be coupled in an AC fashion. In another instance, a pin of a port 194 may be associated with a PCIe coupling, which may be coupled in an AC fashion.

Figure 2B:
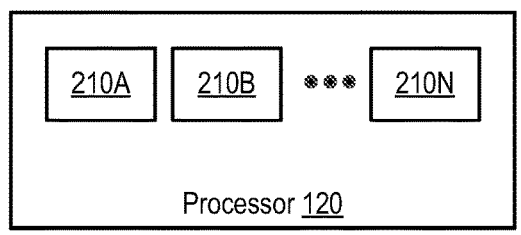
FIGS. 2B and 2C illustrate examples of coupling devices, according to one or more embodiments.
Figure 2C:
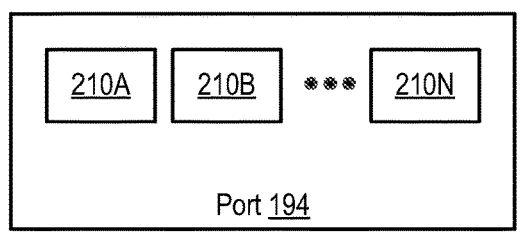

Turning now to FIGS. 2B and 2C, examples of coupling devices are illustrated, according to one or more embodiments. As shown in FIG. 2B, a processor 120 may include coupling devices 210A-210N. As illustrated in FIG. 2C, a port 194 may include coupling devices 210A-210N. In one or more embodiments, one or more of processor 120 IHSFW 172, BMC 185, and device 187 may be utilized in controlling MUXes 220A and 220B of respective coupling devices 210A-210N via respective couplings 282. In one example, multiple coupling devices 210 may be configured the same. For instance, coupling devices 210A and 210B may be configured the same. In another example, multiple coupling devices 210 may be configured differently. For instance, coupling devices 210A and 210B may be configured differently.

Figure 3A:
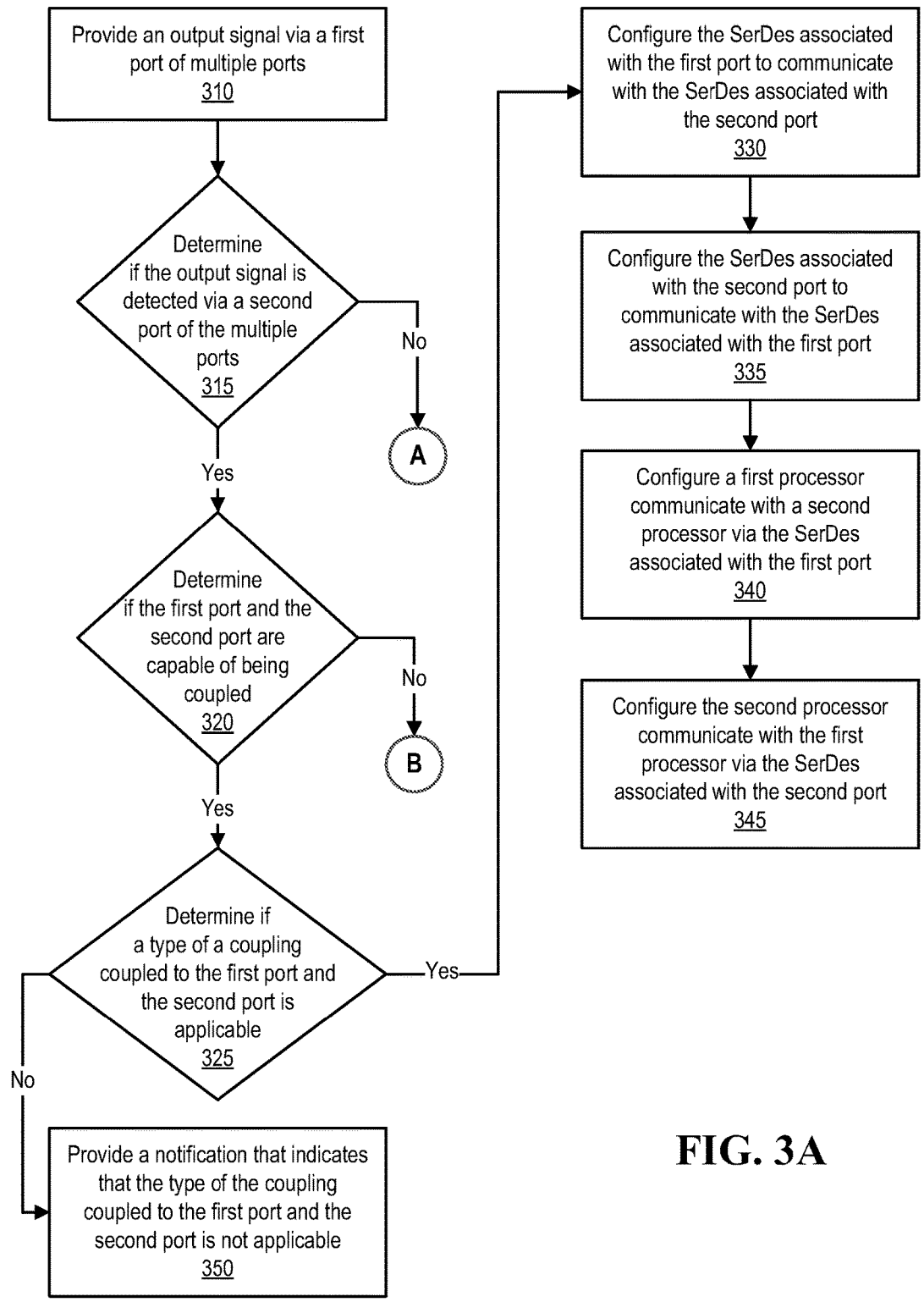
FIGS. 3A and 3B illustrate an example of a method of operating an information handling system, according to one or more embodiments.
Figure 3B:
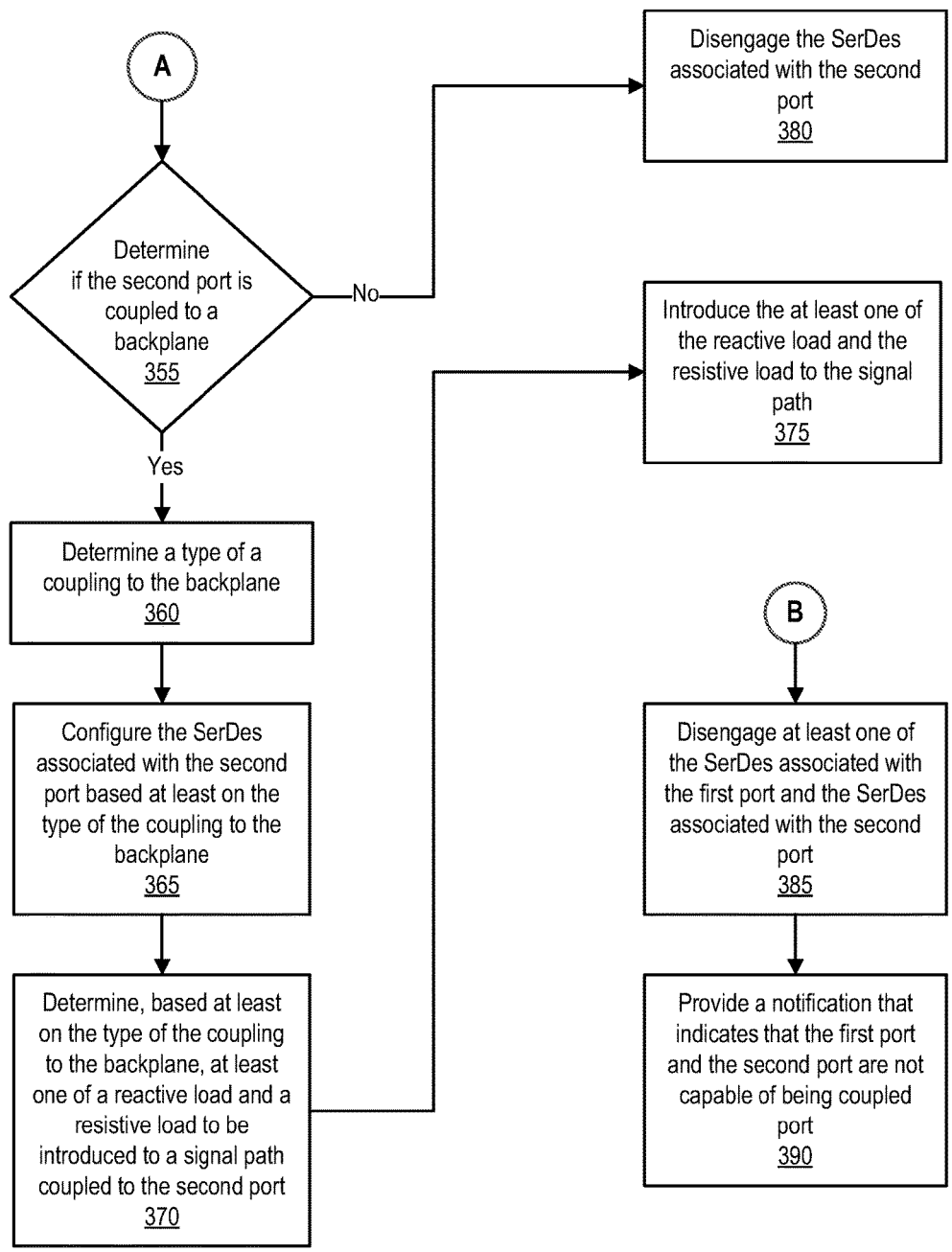

Turning now to FIGS. 3A and 3B, an example of a method of operating an information handling system is illustrated, according to one or more embodiments. At 310, an output signal may be provided via a first port of multiple ports. For example, an output signal may be provided via a first port of ports 194AA, 194AB, 194BA, and 194BB. For instance, device 187 may provide an output signal via a first port of ports 194AA, 194AB, 194BA, and 194BB. In one or more embodiments, the output signal may be or include a stimulus signal.

At 315, it may be determined if the output signal is detected via a second port of the multiple ports. For example, if the output signal is provided via port 194AB, it may be determined if the output signal is detected via a port of ports 194AA, 194BA, and 194BB. For instance, device 187 may determine if the output signal is detected via a second port of the multiple ports. In one or more embodiments, it may be determined if the stimulus signal is detected via the second port of the multiple ports.

If the output signal is detected via the second port of the multiple ports, it may be determined the first port and the second port are capable of being coupled, at 320. For example, device 187 may determine if the first port and the second port are capable of being coupled. If the first port and the second port are not capable of being coupled, at least one of a SerDes associated with the first port and a SerDes associated with the second port may be disengaged, at 385. For example, device 187 may disengage the at least one of the SerDes associated with the first port and the SerDes associated with the second port.

At 390, a notification that indicates that the first port and the second port are not capable of being coupled may be provided. In one example, the notification may be logged. For instance, the notification may be provided to log storage. In another example, BMC 185 may provide the notification. In one instance, BMC 185 may provide the notification to another information handling system. In another instance, BMC 185 may provide the notification to a user (e.g., an administrator). In one or more embodiments, one or more of IHSFW 172, BMC 185, and device 187, among others, may be utilized in providing the notification.

If the first port and the second port are capable of being coupled, it may be determined if a type of a coupling coupled to the first port and the second port is applicable, at 325. For example, device 187 may determine if a type of a coupling coupled to the first port and the second port is applicable. If the type of the coupling coupled to the first port and the second port is applicable, the SerDes associated with first port may be configured to communicate with the SerDes associated with the second port, at 330. For example, the first port may be port 194AB, and the second port may be port 194BA. For instance, SerDes 188AB may be configured to communicate with SerDes 188BA. At 335, the SerDes associated with second port may be configured to communicate with the SerDes associated with the first port. For example, SerDes 188BA may be configured to communicate with SerDes 188AB.

At 340, a first processor may be configured to communicate with a second processor via the SerDes associated with the first port. For example, processor 120A may be configured to communicate with processor 120B via SerDes 188AB. At 345, the second processor may be configured to communicate with the first processor via the SerDes associated with the second port. For example, processor 120B may be configured to communicate with processor 120A via SerDes 188BA.

If the type of the coupling coupled to the first port and the second port is not applicable, a notification, that indicates that the type of the coupling coupled to the first port and the second port is not applicable, may be provided, at 350. In one example, the notification may be logged. For instance, the notification may be provided to log storage. In another example, BMC 185 may provide the notification. In one instance, BMC 185 may provide the notification to another information handling system. In another instance, BMC 185 may provide the notification to a user (e.g., an administrator). In one or more embodiments, one or more of IHSFW 172, BMC 185, and device 187, among others, may be utilized in providing the notification.

If the output signal is not detected via the second port of the multiple ports, it may be determined if the second port is coupled to a backplane, at 355. For example, device 287 may determine if the second port is coupled to a backplane 196. For instance, a backplane 196 may be or include one or more devices 190. If the second port is coupled to the backplane, a type of a coupling to the backplane may be determined, at 360. At 365, the SerDes associated with the second port may be configured based at least on the type of the coupling to the backplane.

At 370, at least one of a reactive load and a resistive load to be introduced to a signal path coupled to the second port may be determined based at least on the type of the coupling to the backplane. For example, device 287 may determine, based at least on the type of the coupling to the backplane, at least one of a reactive load and a resistive load to be introduced to a signal path coupled to the second port. At 375, the at least one of the reactive load and the resistive load may be introduced to the signal path. For example, one or more of coupling devices 210 may introduce the at least one of the reactive load and the resistive load to the signal path.

If the second port is not coupled to a backplane, the SerDes associated with the second port may be disengaged, at 380. In one or more embodiments, disengaging the SerDes associated with the second port may conserve power utilized by IHS 110.

In one or more embodiments, one or more of the method and/or process elements and/or one or more portions of a method and/or processor elements may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with one or more flowcharts, one or more systems, one or more methods, and/or one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   a plurality of processors processor, each of processor of the plurality of processors including a plurality of Serializer/Deserializers;
   a plurality of ports coupled to the plurality of Serializer/Deserializers of each processor of the plurality of processors; and
   a device coupled to the plurality of Serializer/Deserializers of each processor of the plurality of processors and to the plurality of ports;
   wherein the device is configured to:
      provide an output signal via a first port of the plurality of ports;
      determine that the output signal is detected via a second port of the plurality of ports;
      determine if the first port and the second port are capable of being coupled;
      if the first port and the second port are not capable of being coupled:
         disengage at least one of a Serializer/Deserializer (SerDes) associated with the first port and a SerDes associated with the second port; and
         provide a notification that indicates that the first port and the second port are not capable of being coupled;
      if the first port and the second port are capable of being coupled:
         determine if a type of a coupling coupled to the first port and the second port is applicable;
         if the type of the coupling coupled to the first port and the second port is applicable:
            configure the SerDes associated with the first port to communicate with the SerDes associated with the second port; and
            configure a first processor of the plurality of processors to communicate with a second processor of the plurality of processors via the SerDes associated with the first port;
         if the type of the coupling coupled to the first port and the second port is not applicable, provide a notification that indicates that the type of the coupling coupled to the first port and the second port is not applicable;
      determine that the output signal is not detected via the second port of the plurality of ports;
      determine if the second port is coupled to a backplane;
         if the second port is coupled to the backplane:
            determine a type of a coupling to the backplane; and
            configure the SerDes associated with the second port based at least on the type of the coupling to the backplane; and if the second port is not coupled to the backplane, disengage the SerDes associated with the second port.

2. The information handling system of claim 1, wherein the device is further configured to:
after determining the type of the coupling to the backplane, determine, based at least on the type of the coupling to the backplane, at least one of a reactive load and a resistive load to be introduced to a signal path coupled to the second port; and
introduce the at least one of the reactive load and the resistive load to the signal path.

3. The information handling system of claim 1, wherein the device is further configured to:
if the type of the coupling coupled to the first port and the second port is not applicable:
disengage the SerDes associated with the first port; and
disengage the SerDes associated with the second port.

4. The information handling system of claim 1, wherein the device is further configured to:
determine that the output signal is detected via a third port of the plurality of ports;
determine that a type of a coupling coupled to the first port and the third port is applicable;
determine that coupling the first port to another port of the plurality of ports will provide lower data communication latency; and
provide a notification that indicates that coupling the first port to the other port will provide lower data communication latency.

5. The information handling system of claim 2,
wherein the type of the coupling to the backplane includes a peripheral component interconnect express (PCIe); and
wherein the at least one of the reactive load and the resistive load includes a capacitor.

6. The information handling system of claim 4, wherein the device is further configured to:
determine that the output signal is not detected via the second port of the plurality of ports;
wherein the other port is the second port.

7. The information handling system of claim 4, wherein determining that coupling the first port to the other port will provide lower data communication latency is based at least on a distance between the first port and the third port and a distance between the first port and the other port.

8. A method, comprising:
providing an output signal via a first port of a plurality of ports of an information handling system;
determining that the output signal is detected via a second port of the plurality of ports;
determining if the first port and the second port are capable of being coupled;
if the first port and the second port are not capable of being coupled:
disengaging at least one of a Serializer/Deserializer (SerDes) associated with the first port and a SerDes associated with the second port; and
providing a notification that indicates that the first port and the second port are not capable of being coupled;
if the first port and the second port are capable of being coupled:
determining if a type of a coupling coupled to the first port and the second port is applicable;
if the type of the coupling coupled to the first port and the second port is applicable:
configuring the SerDes associated with the first port to communicate with the SerDes associated with the second port;
determining that the output signal is not detected via the second port of the plurality of ports;
determining if the second port is coupled to a backplane;
if the second port is coupled to the backplane:
determining a type of a coupling to the backplane; and
configuring the SerDes associated with the second port based at least on the type of the coupling to the backplane;
if the second port is not coupled to the backplane, disengaging the SerDes associated with the second port; and
if the output signal is detected via the second port:
determining if the first port and the second port are capable of being coupled;
if the first port and the second port are not capable of being coupled:
disengaging the SerDes associated with the second port;
disengaging a SerDes associated with the first port; and
providing a notification that indicates that the first port and the second port are not capable of being coupled; and
determining if a type of a coupling coupled to the first port and the second port is applicable.

9. The method of claim 8, further comprising:
after the determining the type of the coupling to the backplane, determining, based at least on the type of the coupling to the backplane, at least one of a reactive load and a resistive load to be introduced to a signal path coupled to the second port; and
introducing the at least one of the reactive load and the resistive load to the signal path.

10. The method of claim 8, further comprising:
if the type of the coupling coupled to the first port and the second port is not applicable:
disengaging the SerDes associated with the first port; and
disengaging the SerDes associated with the second port.

11. The method of claim 8, further comprising:
determining that the output signal is detected via a third port of the plurality of ports;
determining that a type of a coupling coupled to the first port and the third port is applicable;
determining that coupling the first port to another port of the plurality of ports will provide lower data communication latency; and
providing a notification that indicates that coupling the first port to the other port will provide lower data communication latency.

12. The method of claim 11,
wherein the type of the coupling to the backplane includes a peripheral component interconnect express (PCIe); and
wherein the at least one of the reactive load and the resistive load includes a capacitor.

13. The method of claim 11, further comprising:
determining that the output signal is not detected via the second port of the plurality of ports;
wherein the other port is the second port.

14. The method of claim 11, wherein the determining that coupling the first port to the other port will provide lower data communication latency is based at least on a distance between the first port and the third port and a distance between the first port and the other port.

15. A programmable logic device, configured to:
provide an output signal via a first port of a plurality of ports of an information handling system;
determine that the output signal is detected via a second port of the plurality of ports;
determine if the first port and the second port are capable of being coupled;
if the first port and the second port are not capable of being coupled:
disengage at least one of a Serializer/Deserializer (SerDes) associated with the first port and a SerDes associated with the second port; and
provide a notification that indicates that the first port and the second port are not capable of being coupled;
if the first port and the second port are capable of being coupled:
determine if a type of a coupling coupled to the first port and the second port is applicable;
if the type of the coupling coupled to the first port and the second port is applicable:
configure the SerDes associated with the first port to communicate with the SerDes associated with the second port;
determine that the output signal is not detected via the second port of the plurality of ports;
determine if the second port is coupled to a backplane;
if the second port is coupled to the backplane:
determine a type of a coupling to the backplane; and
configure the SerDes associated with the second port based at least on the type of the coupling to the backplane; and
if the second port is not coupled to the backplane, disengage the SerDes associated with the second port.

16. The programmable logic device of claim 15, wherein the programmable logic device is further configured to:
after determining the type of the coupling to the backplane, determine, based at least on the type of the coupling to the backplane, at least one of a reactive load and a resistive load to be introduced to a signal path coupled to the second port; and
introduce the at least one of the reactive load and the resistive load to the signal path.

17. The programmable logic device of claim 15, wherein the programmable logic device is further configured to:
determine that the output signal is detected via a third port of the plurality of ports;
determine that a type of a coupling coupled to the first port and the third port is applicable;
determine that coupling the first port to another port of the plurality of ports will provide lower data communication latency; and
provide a notification that indicates that coupling the first port to the other port will provide lower data communication latency.

* * * * *